United States Patent [19]
Yamaji

[11] Patent Number: 5,714,916
[45] Date of Patent: *Feb. 3, 1998

[54] MODULATOR

[75] Inventor: Takafumi Yamaji, Ichikawa, Japan

[73] Assignee: Kabushiki Kaisha Toshiba, Kanagawa-ken, Japan

[*] Notice: The term of this patent shall not extend beyond the expiration date of Pat. No. 5,534,827.

[21] Appl. No.: 462,032

[22] Filed: Jun. 5, 1995

Related U.S. Application Data

[62] Division of Ser. No. 33,750, Mar. 19, 1993.

[30] Foreign Application Priority Data

Mar. 30, 1992 [JP] Japan ........................... 4-74471
Feb. 8, 1993 [JP] Japan ........................... 5-20072

[51] Int. Cl.$^6$ ........................................... H03C 5/00
[52] U.S. Cl. ........................... 332/103; 332/104; 332/149
[58] Field of Search ........................... 332/106, 115, 332/116, 159, 149, 103, 104, 105

[56] References Cited

U.S. PATENT DOCUMENTS

| | | | |
|---|---|---|---|
| 3,466,460 | 9/1969 | Connolly | 327/357 |
| 4,319,359 | 3/1982 | Wolf | 375/218 |
| 4,320,361 | 3/1982 | Kikkert | 332/112 |
| 5,249,201 | 9/1993 | Posner et al. | 332/106 |
| 5,530,722 | 6/1996 | Dent | 332/103 |

FOREIGN PATENT DOCUMENTS 2-138609  5/1990  Japan .

OTHER PUBLICATIONS

H. Inose, Y. Yasuda, J. Murakami, "A Telemetering System by Code Manipulation –Δ–Σ Modulation," IRE Trans on Space Electronics and Telemetry, Sep. 1962, pp. 204–209.
R. Schreier, "An Empiricl Study of High–Order Single Bit Delta–Sigma Modulators," IEEE Trans. on CAS., vol. 40, No. 8, Aug. 1993.
S. Jantzi, W. Snelgrove, P. Ferguson, Jr., "A Fourth–Order Bandpass Sigma–Delta Modulator," IEEE Journal of Solid–State Circuits, vol. 28, No. 3 Mar. 1993.
"A Precise Digital Modulated Signal Generator", Masahiro Kuoroda, The 1991 Autumn Convention Thesis B–239 of The Institute of Electronics, Information, and Communication Engineers, (1991).

*Primary Examiner*—Andrew M. Dolinar
*Attorney, Agent, or Firm*—Finnegan, Henderson, Farabow, Garrett & Dunner, L.L.P.

[57] ABSTRACT

In an amplitude modulator, a delta sigma modulator converts a digital or analog modulation signal into a binary signal. The binary signal and a carrier signal are sent to a multiplication circuit. The phase of the carrier signal is changed to normal phase or opposite phase. The resultant carrier signal is output as an amplitude modulation wave. An orthogonal modulator sends a local oscillation signal to a phase shifter. The phase shifter outputs two carrier signals with phases which differ by 90° each other. The modulation signal and carrier signals are sent to the amplitude modulator. The amplitude modulator outputs an amplitude modulation signal. These signals are sent to an analog signal composing unit. The analog signal composing unit composes the input signals and outputs an amplitude and phase modulation signal.

21 Claims, 22 Drawing Sheets

P1 = D1
P2 = D1·D2 + $\overline{D1}$·$\overline{D2}$

|   | IR | Qr |
|---|----|----|
| a | 1  | 1  |
| b | -1 | 1  |
| c | -1 | -1 |
| d | 1  | -1 |
| e | 0  | 0  |

|   | Ir   | Qr    |
|---|------|-------|
| a | 1    | 0     |
| b | -1/2 | √3/2  |
| c | -1/2 | √3/2  |

FIG. 24

|   | I | II | III |
|---|---|----|-----|
| a | 1 | 2  | 3   |
| b | 2 | 3  | 1   |
| c | 3 | 1  | 2   |

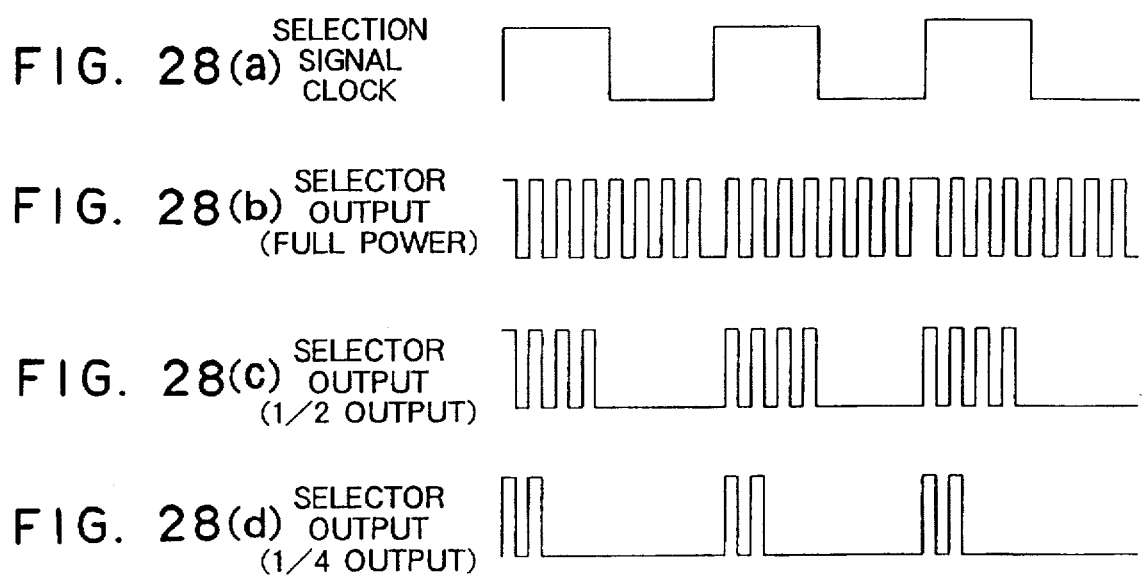
FIG. 28(a) SELECTION SIGNAL CLOCK
FIG. 28(b) SELECTOR OUTPUT (FULL POWER)
FIG. 28(c) SELECTOR OUTPUT (1/2 OUTPUT)
FIG. 28(d) SELECTOR OUTPUT (1/4 OUTPUT)
FIG. 29
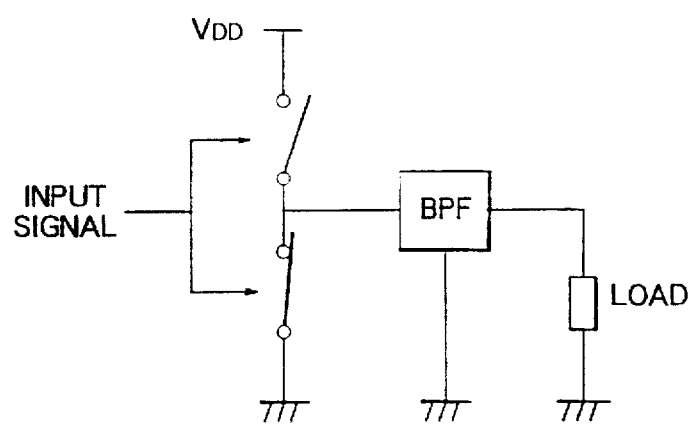

MODULATOR

This is a divisional of application Ser. No. 08/033,750, filed Mar. 19, 1993.

BACKGROUND OF THE INVENTION

1. Field of the Invention

The present invention relates to a modulator used for amplitude modulation or amplitude and phase modulation, in particular, to a modulator suitable for an integrated circuit.

2. Description of the Related Art

Nowadays, portable radio units such as portable telephone sets are being widely used. In these units, small size and low power consumption are very important factors to accomplish. In this circumference, it is desired to reduce the size and power consumption of modulation and demodulation circuits.

FIG. 30 is a block diagram showing the construction of an example of a conventional orthogonal modulator.

This orthogonal modulator comprises D/A converters 71 and 72, low-pass filters 73 and 74, a synthesizer 79, a π/2 phase shifter 80, mixers 77 and 78, and a composing unit 81. The D/A converters 71 and 72 each convert a digital modulation signal into an analog modulation signal. The low-pass filters 73 and 74 remove sampling noises contained in the outputs of the D/A converters 71 and 72. The synthesizer 79 generates a local signal. The π/2 phase shifter 80 shifts the phase of the frequency of the local signal received from the synthesizer 79 by π/2. The mixer 77 amplitude-modulates the output of the π/2 phase shifter 80 with the output of the low-pass filter 73. The mixer 78 amplitude-modulates the output of the synthesizer 79 with the output of the low-pass filter 74. The composing unit 81 composes the outputs of the mixers 77 and 78 and outputs an amplitude and phase modulation wave. The mixers 77 and 78 can be constructed of an amplitude modulator.

In the orthogonal modulator of this type, when the circuits downstream of the D/A converters 71 and 72 process analog signals, various errors and distortions take place. To reduce the distortion, a satisfactorily large bias current is required for a relevant signal. Thus, the current consumption tends to become large. This problem also takes place when a mixer is used for an amplitude modulator. In addition, an orthogonal modulator which performs a modulation with a high accuracy requires a compensation means such as a compensation circuit, a compensation signal generation circuit, or the like for compensating an error, thereby increasing the circuit scale.

In The 1991 Autumn Convention Thesis B-239 of The Institute of Electronics, Information, and Communication Engineers, a method for forming digital signals for a high accuracy orthogonal modulator is disclosed. However, in this method, digital signals with a large number of bits should be processed at high speed so as to improve the accuracy thereof. Thus, the circuit scale becomes large. In addition, the power consumption increases. In other words, this method is not suitable for portable radio terminals and so forth.

As described above, the conventional amplitude modulators or orthogonal modulators which process analog signals require satisfactorily large bias current, thereby increasing current consumption. On the other hand, modulators which form digital signals should process digital signals with a large number of bits at high speed, thereby increasing the circuit scale and power consumption.

SUMMARY OF THE INVENTION

The present invention is made from the above-mentioned point of view.

A first object of the present invention is to provide a modulator having a small distortion and small power consumption.

A second object of the present invention is to provide a modulator having a high accuracy modulation with a small circuit scale.

A third object of the present invention is to provide a modulator which allows the size of a final product to be decreased.

A fourth object of the present invention is to provide a modulator which is suitable for a microcomputer and where a control system can be constructed without necessity of an interface circuit or with a simple interface circuit.

A fifth object of the present invention is to provide a modulator having a large degree of freedom of designing the frequency characteristic of quantization noise and a low clock frequency, thereby decreasing the power consumption.

To accomplish such objects, the modulator of the first aspect of the present invention comprises a signal conversion means for converting a modulation signal into a binary or ternary signal, and a multiplication means for inputting the binary or ternary signal and a carrier signal and for outputting the product of the carrier signal and the binary or ternary signal.

The modulator of the second aspect of the present invention comprises a signal conversion means for converting a modulation signal into selection signals according to the modulation signal, and a selection means for selecting and outputting one of signals with the same frequency and different phase or amplitude according to the selection signals.

The modulator of the third aspect of the present invention comprises a linear converter for inputting a plurality of modulation signals and a plurality of feed-back signals as an input vector and for linearly converting the input vector, an encoder for vector-quantization the linearly converted vector and for outputting the resultant signals as selection signals, and a vector decoder for decoding the encoded output into the plurality of feed-back signals.

The modulation method of the fourth aspect of the present invention comprises the steps of (1) converting a modulation signal into selection signals according to the modulation signal and (2) selecting one of signals with the same frequency and different phases or amplitudes according to the selection signals.

In this invention, a conversion means for converting a modulation signal into a binary signal is equivalent to a D/A converter of a conventional orthogonal modulator.

When the conversion means outputs a sequence of 1, −1, 1, −1, and so forth, according to a binary switching signal with two values of for example 1 and −1. The average of the output is 0. When the modulation means outputs a sequence of 1, 1, −1, 1, 1, −1, and so forth, the average thereof is ⅓.

An example of the conversion means which outputs a binary signal sequence whose average becomes a desired analog signal is a delta sigma modulator.

The process for averaging a signal sequence which is output from the modulation means is performed by passing the signal to a low-pass filter. In other words, unnecessary signal components such as quantization noise and so forth tend to be distributed much in the high frequency range.

Thus, by extracting only low frequency components with a low-pass filter, a required signal component can be obtained.

According to the basic conception of the present invention, a binary signal sequence whose average becomes a desired analog signal and a carrier signal are mixed so as to obtain an amplitude modulation signal. In other words, by a means which outputs $\cos\omega t$ in the case that the output of the conversion means is 1 and which outputs $-\cos\omega t$ in the case that the output of the conversion means is $-1$, when a sequence of 1, 1, $-1$, 1, 1, $-1$, and so forth is input, the average of $\frac{1}{3}\cos\omega t$ is output. This average process is equivalent to a process which passes a signal to a band-pass filter whose center angular frequency is $\omega$.

By performing the above signal process for two orthogonal components, an orthogonal modulation can be accomplished. By a means which outputs $\cos\omega t$, $-\cos\omega t$, $\sin\omega t$, and $-\sin\omega t$ according to binary outputs of first and second conversion means, an orthogonal modulation is accomplished.

Although the output signals contain quantization noise and higher harmonic components as well as a desired signal, since the desired signal is present in the vicinity of a carrier frequency, unnecessary signal components are distributed in a band relatively apart from the carrier frequency.

The conventional analog system requires an analog multiplication circuit. However, according to the present invention, since the amplitude of modulation signal, carrier signal, and modulated signal is constant, with a switching circuit, signal processes for the multiplication and composition of orthogonal components can be performed. In addition, the switching signal can withstand amplitude error and distortion more easily than the analog circuit does. Thus, by using a signal whose error is small on time axis, amplitude modulator or orthogonal modulator can be accomplished with high accuracy.

The analog circuit requires a signal with a large amplitude so as to reduce the influence of noise. To decrease the distortion, a bias current whose amplitude is larger than the amplitude of the signal current. On the other hand, the switching circuit can decrease the amount of the bias current in the range that the operation speed of the circuit is assured. In addition, since the present invention can be accomplished by a signal process of one bit, the circuit scale thereof is similar to that of the analog circuit. Thus, the current consumption can be decreased.

In the delta sigma modulation system, a multi value output with three values or more is used to decrease the amount of quantiziation noise. In this system, when $-1$, 0, and 1 accord with $-\cos\omega$, 0, and $\cos\omega t$, an amplitude modulation signal can be obtained as in the binary system. Thus, in the multi value system with three values or more, as in the binary system, an amplitude modulator or orthogonal modulator can be formed. A ternary system can be formed with a circuit scale similar to that of a binary system. The more the number of values, the more the system resembles to a conventional digital system or analog systems. Thus, although the amount of quantization noise decreases, the circuit scale becomes large. In addition, the error factors and power consumption increase.

As described above, according to the present invention, since part or all of the amplitude modulator and orthogonal modulator can be constructed of a switching circuit, the influence of modulation error due to deviation of device values can be prevented. In addition, since only signals of one bit are handled, the circuit scale can be decreased in comparison with that of the conventional digital type system. Moreover, since the switching circuit does not have a distortion unlike the analog circuit, the power consumption can be decreased in the range that the switching operation speed is not affected. By averaging the output of a sequence of $\cos\omega t$, $\cos\omega t$, and $-\cos\omega t$, $\frac{1}{3}\cos\omega t$ can be obtained. Likewise, by averaging the output of a sequence of $\cos\omega t$, $\cos\omega(t+\phi)$, $\cos\omega t$, $\cos(\omega t+\phi)$, and so forth, $\frac{1}{2}\cos\omega t+\frac{1}{2}\cos(\omega t+\phi)=\cos(\phi/2)\cos(\omega t+\phi/2)$ is obtained.

As described above, to obtain a required signal, it is not necessary to use signals whose phases which differs by 90° as reference signals. For example, as with three phase AC, by switching signals with phases which differs by 120°, an amplitude and phase modulation can be accomplished. In this case, part of the frequency components is a desired signal. Thus, signals should be switched so that quantization noise is distributed much in a frequency band far apart from the frequency band of the desired wave. This switching signal is generated by a vector delta sigma modulator. An amplitude and phase modulator Using two sets of delta sigma modulators should output signals with the same amplitude and whose phases differ by 90° each other. However, by using the vector delta sigma modulation, an output with any combination of amplitude and phases can be obtained. In addition, since a loop filter of a delta sigma modulator handles a scalar signal, its transfer function can accomplish only a rational function of real coefficients. Thus, the distribution of quantization noise of the output of the amplitude and phase modulator is symmetrical to the carrier frequency. On the other hand, when the vector delta sigma modulator is used, a linear modulator is equivalent to the loop filter of the delta sigma modulator. Thus, the transfer function of complex coefficients can be apparently accomplished. Thus, the distribution of quantization noise of the output of the amplitude and phase modulator can become asymmetrical to the carrier frequency. For example, in the situation that a signal with a center frequency of 901 MHz is transmitted with a radio system which strictly restricts an unnecessary radiation power ranging from 900 MHz to 910 MHz, when a delta sigma modulator is used, since the distribution of quantization noise is symmetrical to the center frequency, the delta sigma modulator should be designed to decrease the amount of quantization noise in the range from 892 MHz to 910 MHz. On the other hand, since the vector delta sigma modulator can allow the distribution of quantization noise to become asymmetrical, the vector delta sigma modulator can be designed to decrease the amount of the quantization noise in the range from 900 MHz to 910 MHz. In other words, to decrease the amount of noise in a wide frequency range, the frequency to be sampled should be raised. However, the higher the speed of the circuit becomes, the more the power is consumed. On the other hand, since the vector delta sigma modulation has a large degree of freedom of designing the frequency characteristic of quantization noise and can lower the sampling frequency, the power consumption thereof can be decreased.

These and other objects, features and advantages of the present invention will become more apparent in light of the following detailed description of a best mode embodiment thereof, as illustrated in the accompanying drawings.

BRIEF DESCRIPTION OF DRAWINGS

FIG. 24 is a table for explaining an output of a selector shown in FIG. 23;

FIGS. 28(a)–28(d) are schematic diagrams showing waveforms for explaining an output power control system according to the present invention;

FIG. 29 is a circuit diagram of a class D amplifier using the output power control system according to the present invention.

DESCRIPTION OF PREFERRED EMBODIMENTS

Next, with reference to the accompanying drawings, embodiments according to the present invention will be described.

Figure 1:
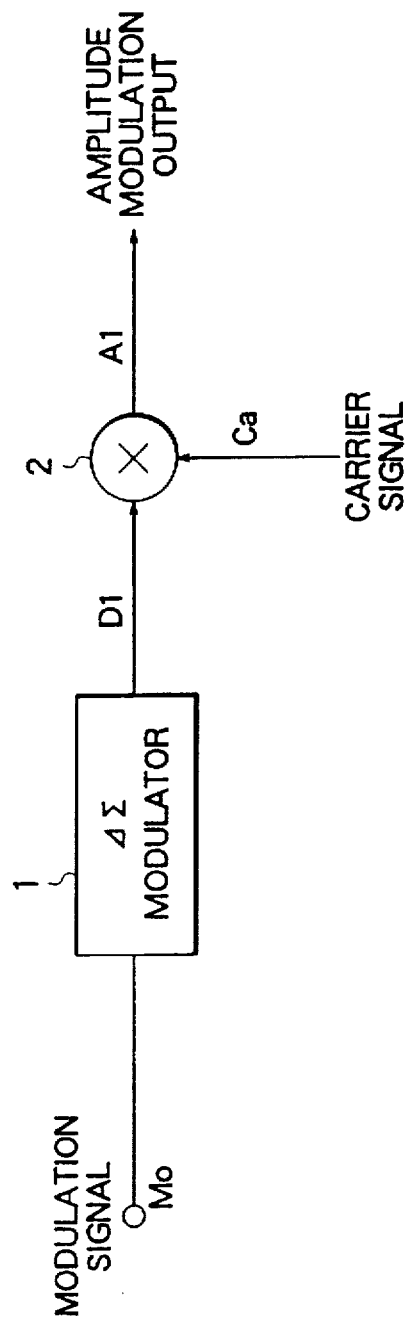
FIG. 1 is a block diagram sowing the construction of an amplitude modulator of a first embodiment according to the present invention.

FIG. 1 is a block diagram sowing the construction of an amplitude modulator of a first embodiment according to the present invention.

A digital or analog modulation signal Mo is sent to a delta sigma converter 1. The delta sigma converter 1 converts the signal Mo into a binary signal D1. The signal D1 and a carrier signal Ca are sent to a multiplication circuit 2. The multiplication circuit 2 changes the phase of the carrier signal Ca to the normal phase or opposite phase according to the signal D1 and outputs the resultant signal as an amplitude modulation wave A1. Although an analog multiplication circuit such as a Gilbert multiplication circuit or a diode ring modulation circuit can be used for the multiplication circuit 2, an exclusive-OR circuit can be used. Even if an analog multiplication circuit is used, since the amplitude of input and output signals are constant, it is not necessary to use a circuit of a linear type unlike the conventional amplitude modulation circuit.

When the delta sigma modulator 1 is of a ternary type, the output of the multiplication circuit 2 is one of normal phase, none, and opposite phase. For the multiplication circuit 2, an analog multiplication circuit or ternary logic circuit is used.

A delta sigma modulator 1 shown in FIG. 1 can be substituted with another modulation circuit which outputs a binary or ternary signal sequence whose average value becomes a desired analog signal. For example, the delta sigma modulator 1 can be substituted with for example a pulse width modulator (PWM) or another pulse density modulator. In particular, a digital signal can be transmitted by a system having a memory as a conversion circuit, memory addresses as modulation signals, and a circuit which outputs a binary signal sequence.

On a time axis, the amplitude modulator 1 outputs signals with the same amplitude and where a desired signal and unnecessary signals such as quantization noise are superimposed. However, on a frequency axis, the component of the desired signal is present in the vicinity of the carrier frequency. The components of the unnecessary signals are distributed much in a frequency band comparatively apart from the carrier frequency rather than in the vicinity of the carrier frequency. Thus, by removing the components of the unnecessary signals with a filter, the desired amplitude modulation signal can be obtained.

Figure 2:
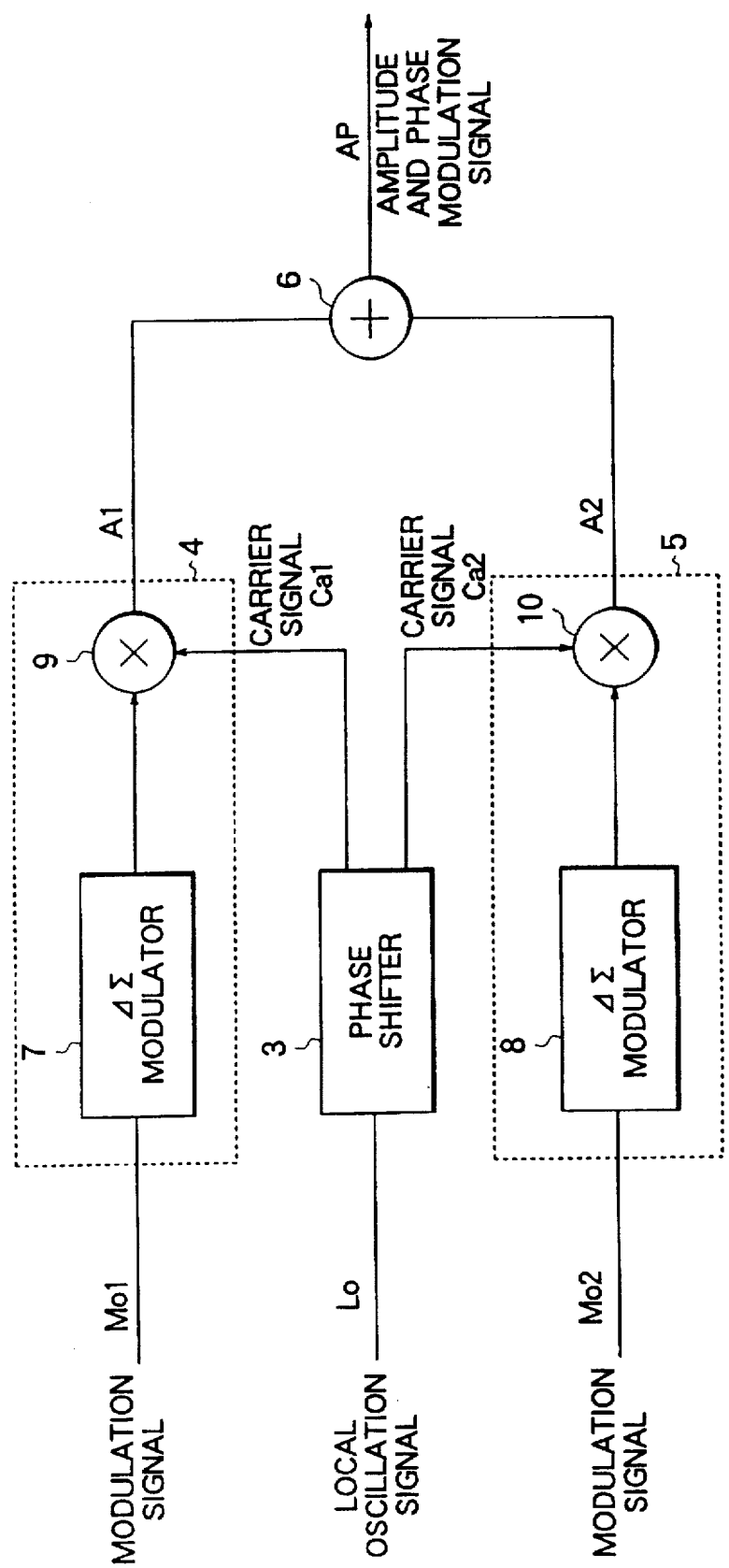
FIG. 2 is a block diagram showing the construction of an orthogonal modulator of a second embodiment according to the present invention.

FIG. 2 is a block diagram showing the construction of an orthogonal modulator of a second embodiment according to the present invention.

A local oscillation signal Lo is sent to a phase shifter 3. The phase shifter 3 outputs carrier signals Ca1 and Ca2 whose phases differ by 90° each other. The modulation signal Mo1 and the carrier signal Ca1 are sent to an amplitude modulator 4. The modulation signal Mo2 and the carrier signal Ca2 are sent to an amplitude modulator 5. The construction of the amplitude modulators 4 and 5 is similar to that of the amplitude modulator described in the first embodiment (see FIG. 1). Thus, the amplitude modulators 4 and 5 output amplitude modulation signals A1 and A2, respectively. These signals A1 and A2 are sent to an analog signal composing unit 6. The unit 6 outputs an amplitude and phase modulation signal AP. In FIG. 2, reference numerals 7 and 8 represent delta sigma modulators. Reference numerals 9 and 10 represent multiplication circuits.

Figure 3:
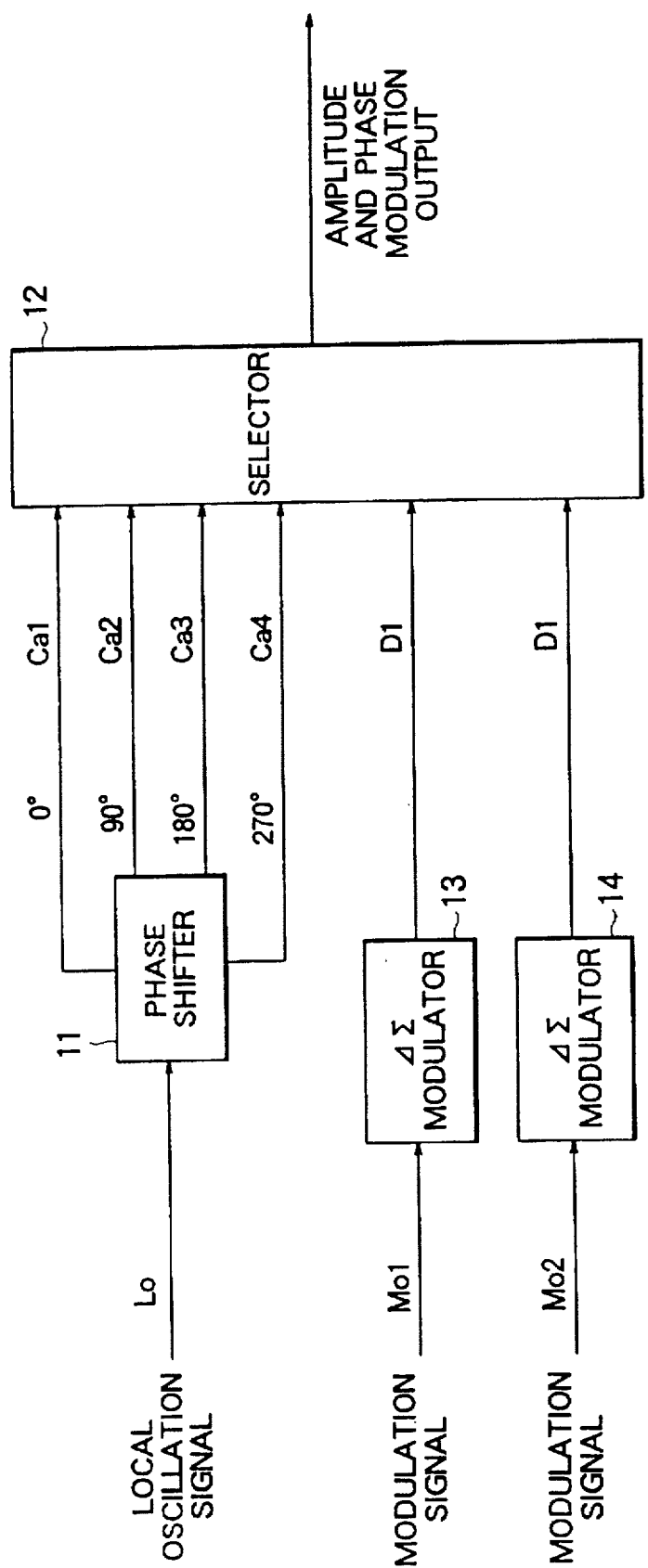
FIG. 3 is a block diagram showing the construction of an orthogonal modulator of a third embodiment according to the present invention.

FIG. 3 is a block diagram showing the construction of an orthogonal modulator of a third embodiment according to the present invention.

A local oscillation signal Lo is sent to a phase shifter 11. The phase shifter Lo separates the signal Lo into four carrier signals Ca1, Ca2, Ca3, and Ca4 whose phases are 0°, 90°, 180°, and 270°, respectively. These carrier signals are sent to a selector 12. In addition, output signals D1 and D2 of two delta sigma modulators 13 and 14 are sent to the selector 12. The two delta sigma modulators 13 and 14 can be substituted with other conversion circuits which output a binary signal sequence whose average becomes a desired analog signal (described in the first embodiment).

The selector 12 selects and outputs one of the four input signals Ca1, Ca2, CA3, and CA4 according to the two input signals D1 and D2. For example, in the case that when (D1, D2) are (1, 1) Ca1 is output, when (D1, D2) is (1, −1) Ca2 is output, when (D1, D2) is (−1, −1) Ca3 is output, and when (D1, D2) is (−1, 1), Ca4 is output, an amplitude and phase modulation signal which is similar to that of the second embodiment can be obtained. In this amplitude and phase modulation output, the component of a desired signal and the components of unnecessary signals are superimposed. The amplitude of the output is constant. By removing the components of the unnecessary signals distributed much in a frequency band comparatively apart from the carrier frequency with a filter, a desired amplitude and phase modulation signal can be obtained.

Figure 4:
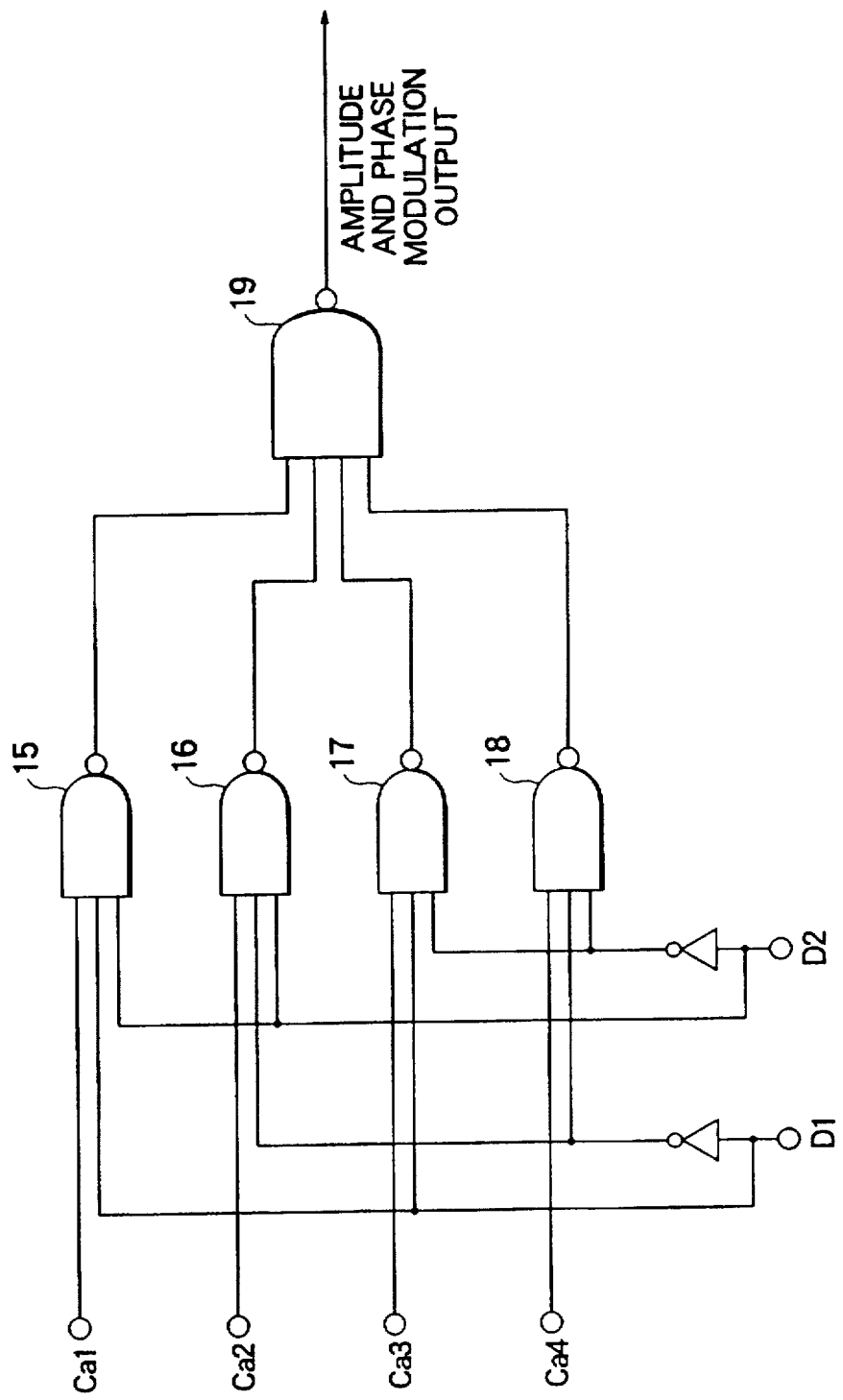
FIG. 4 is a circuit diagram showing the construction of an example of the selector of the third embodiment according to the present invention.

FIG. 4 is a circuit diagram showing the construction of an example of the selector 12 of the third embodiment. Normally, in a logical circuit, data is represented by two values 1 and 0. However, in this example, two values 1 and −1 are used.

In the case that when (D1, D2) is (1, 1) Ca1 is output, when (D1, D2) is (1, −1) Ca2 is output, when (D1, D2) is (−1, −1) Ca3 is output, and when (D1, D2) is (−1, 1) Ca4 is output, these signals can be represented by the following expression (logical expression 1).

$$D1.D2.Ca1+D1.\overline{D2}.Ca2+\overline{D1}.\overline{D2}.Ca3+D1.\overline{D2}.Ca4 \ldots$$

(logical expression 1)

When the logical expression i is modified according to the law of de Morgan, the following expression (logical expression 2) is obtained.

$$\overline{((D1 \cdot D2 \cdot Ca1) \cdot (D1 \cdot \overline{D2} \cdot Ca2) \cdot (\overline{D1} \cdot \overline{D2} \cdot Ca3) + (\overline{D1} \cdot D2 \cdot Ca4)}$$ (logical expression 2)

The logical circuit shown in FIG. 4 is equivalent to the logical expression 2.

A three-input NAND circuit outputs −1 only when all inputs thereof is 1. In FIG. 4, when (D1, D2) are (1, 1), a three- input NAND circuit 15 which inputs Ca1 outputs the inverted signal of Ca1. Since the other three-input NAND circuits 16, 17, and 18 input at least one "−1", they always output 1. Thus, a four-input NAND circuit 19 outputs the inverted signal of the inverted signal of Ca1, namely Ca1. Likewise, when (D1, D2) are (1, −1), Ca2 is selected and output. When (D1, D2) are (−1, −1), Ca3 is selected and output. When (D1, D2) are (−1, 1), Ca4 is selected and output.

Figure 5:
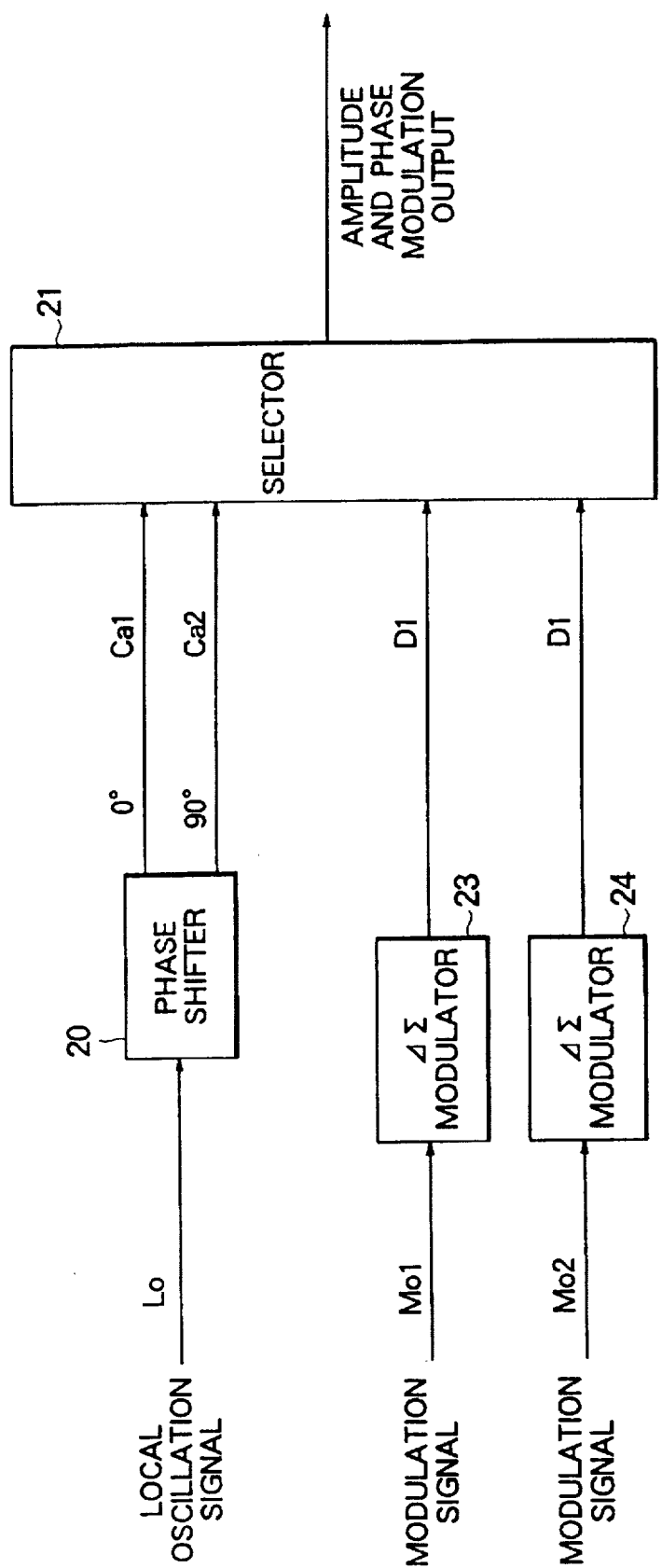
FIG. 5 is a block diagram showing an orthogonal modulator of a fourth embodiment according to the present invention.

FIG. 5 is a block diagram showing an orthogonal modulator of a fourth embodiment according to the present invention.

A carrier signal is sent to a phase shifter 20. The phase shifter 20 separates the carrier signal into two signals whose phases are 0° and 90°. The separated signals are sent to a selector 21. In addition, output signals D1 and D2 of two sigma delta converters 23 and 24 are sent to the selector 21. The delta sigma modulators 23 and 24 can be substituted with other conversion circuits which output a binary signal sequence whose average is a desired analog signal.

The selector 21 selects and outputs one of the input signals Ca1, Ca2, and the inverted signals thereof according to the two input signals D1 and D2. For example, when (D1, D2) are (1, 1), the selector 21 outputs Ca1. When (D1, D2) are (1, −1), the selector 21 outputs Ca2. When (D1, D2) are (−1, −1), the selector 21 outputs the inverted signal of Ca1. When (D1, D2) are (−1, 1), the selector 21 outputs the inverted signal of Ca2. The signals selected and output by the selector 21 can be represented by the following expression (logical expression 3).

$$D1.D2.Ca1+D1.\overline{D2}.Ca2+\overline{D1}.D2.\overline{Ca1}+\overline{D1}.\overline{D2}.\overline{Ca2} \ldots$$

(logical expression 3)

Figure 6:
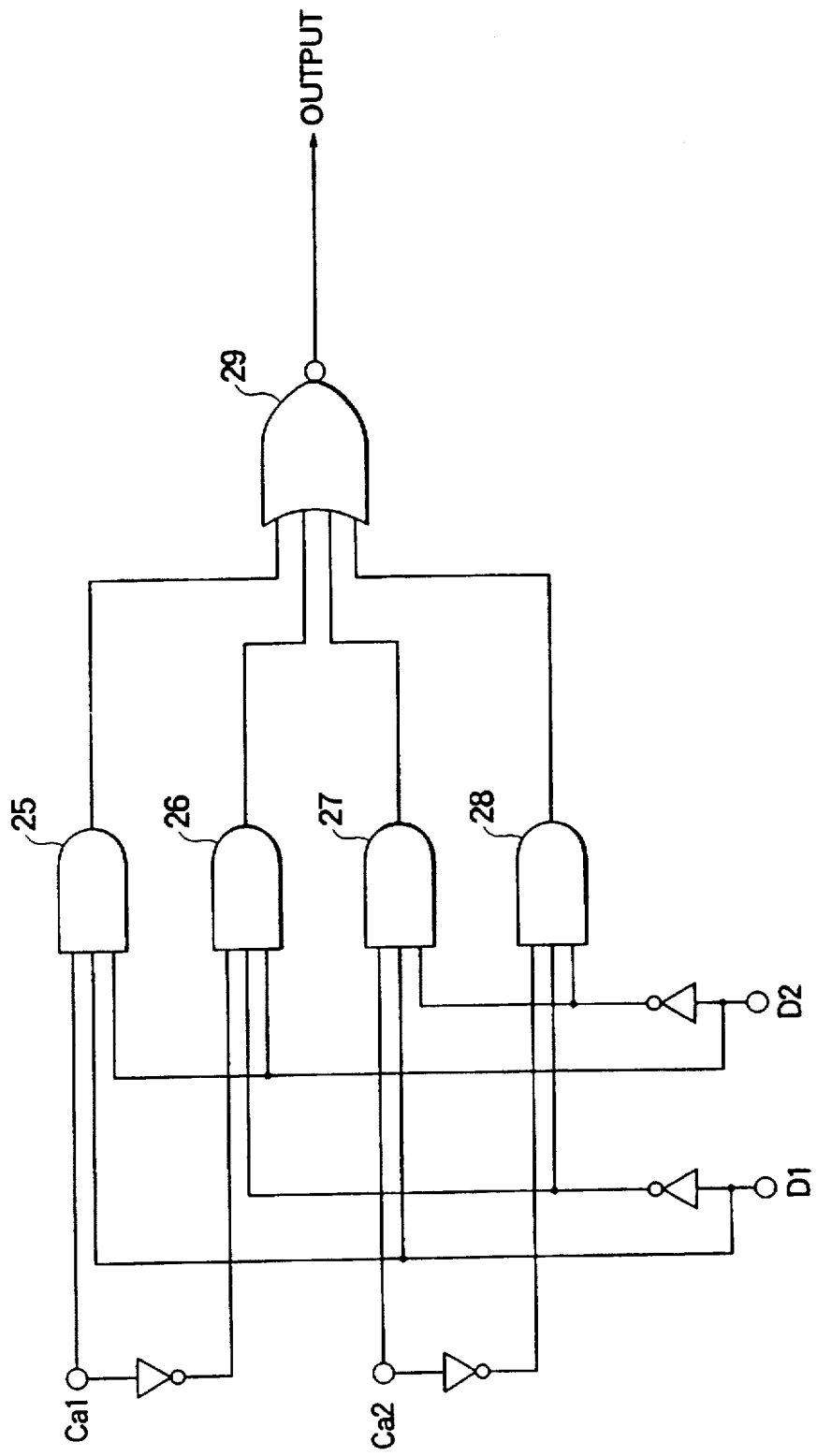
FIG. 6 is a circuit diagram showing the construction of a circuit equivalent to the logical expression 3.

FIG. 6 is a circuit diagram showing the construction of a circuit equivalent to the logical expression 3. The circuit of the figure comprises three-input AND circuits 25 to 28 and a four-input OR circuit 29. This circuit outputs a signal similar to that of the third embodiment.

Figure 7:
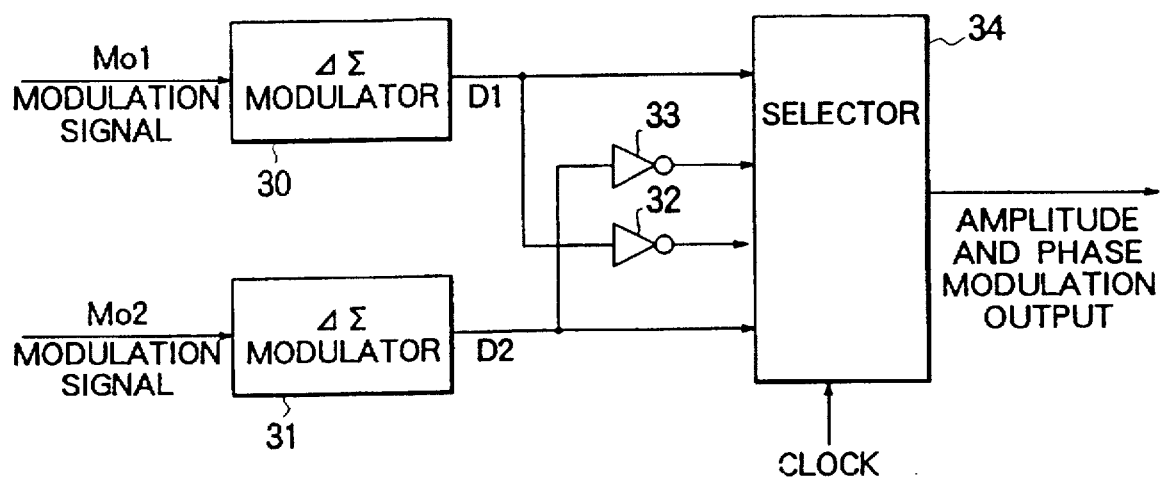
FIG. 7 is a block diagram showing the construction of an orthogonal modulator of a fifth embodiment according to the present invention.

FIG. 7 is a block diagram showing the construction of an orthogonal modulator of a fifth embodiment according to the present invention.

Figure 8:
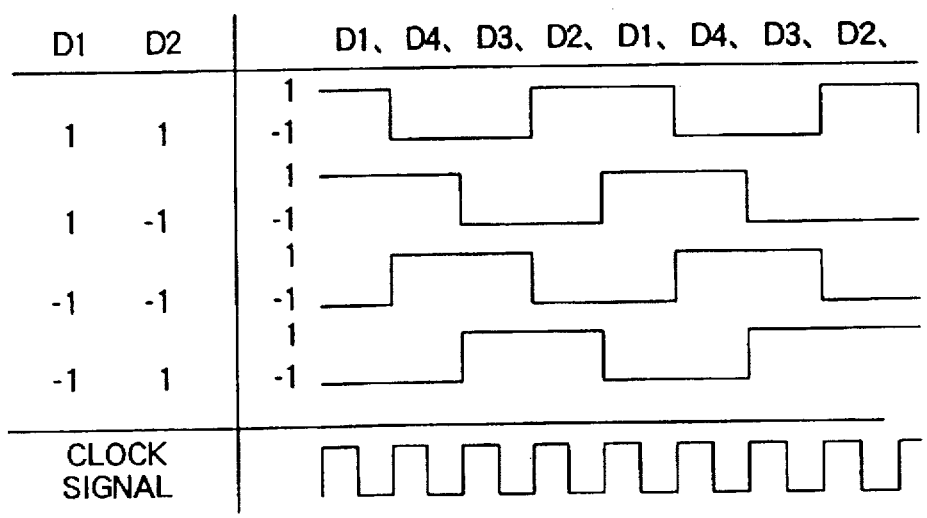
FIG. 8 is a timing chart showing the relation of input and output of the selector of the fifth embodiment according to the present invention.

Two delta sigma modulators 30 and 31 outputs signals D1 and D2, respectively. These signals are sent to a selector 34. In addition, these signals D1 and D2 are sent to inverters 32 and 33, respectively. The inverters 32 and 33 output the inverted signals of D1 and D2 as D3 and D4, respectively. The inverted signals D3 and D4 are sent to the selector 34. Moreover, the selector 34 receives a clock signal with a frequency four times higher than the frequency of a carrier. The selector 34 successively selects and outputs D1, D4, D3, and D2 whenever it receives a clock pulse. As a result, as shown in FIG. 8, the selector 34 outputs the signals D1, D4, D3, and D2 in the following manner. When (D1, D2) are (1, 1), the selector 34 repeatedly outputs 1, −1, −1, 1 in the order of D1, D4, D3, and D2. When (D1, D2) are (1, −1), the selector 34 repeatedly outputs 1, 1, −1, −1. When (D1, D2) are (−1, −1), the selector 34 repeatedly outputs −1, 1, 1, −1. When (D1, D2) are (−1, 1), the selector 34 repeatedly outputs −1, −1, 1, 1. Thus, an output which is similar to the above-mentioned output is obtained.

When each of D1 and D2 has three values −1, 0, and 1, by successively selecting and outputting D1, D2, and the inverted signals thereof D3, and D4 according to a clock signal, an orthogonal modulator can be formed.

Figure 9:
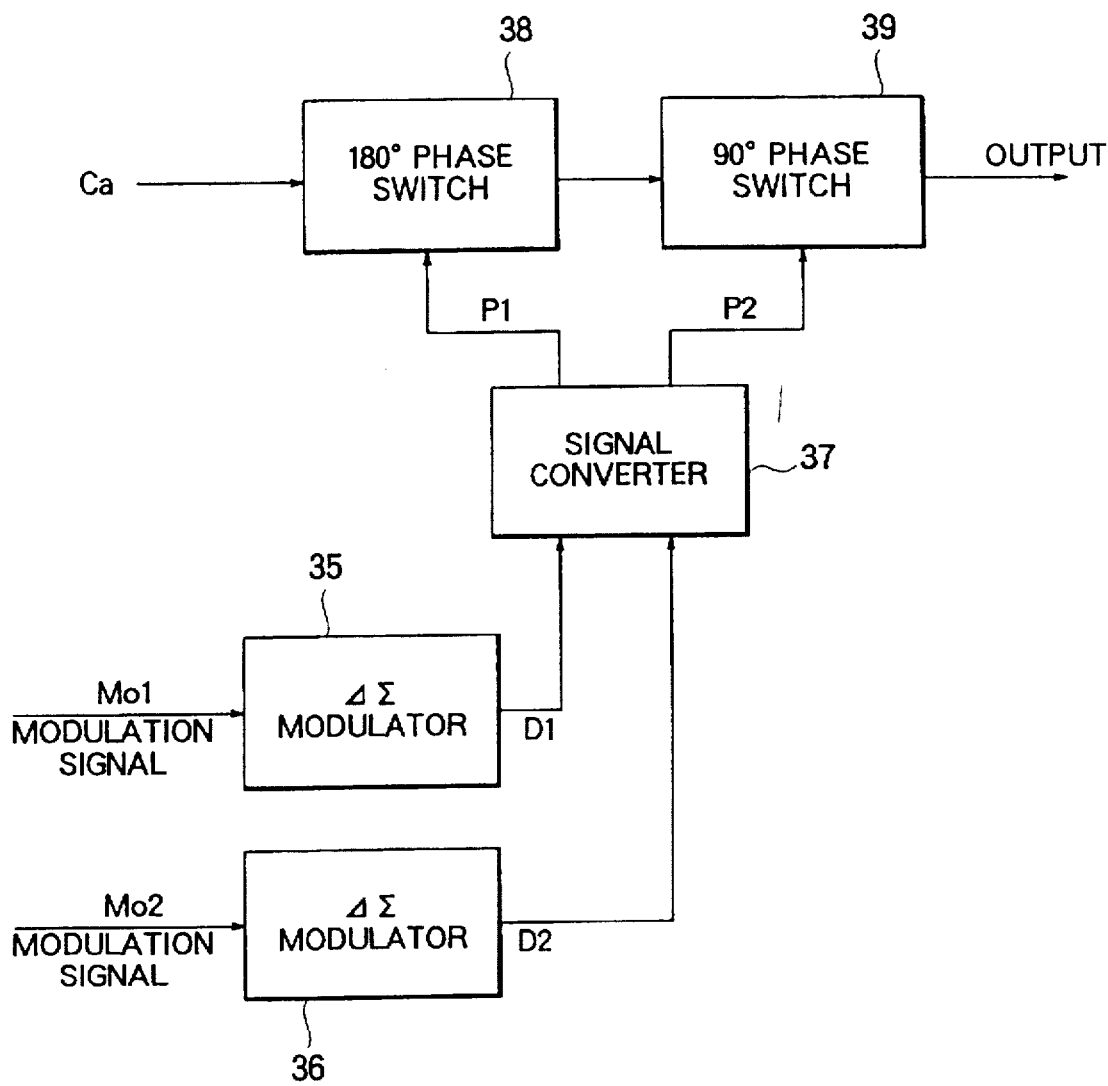
FIG. 9 is a block diagram showing the construction of an orthogonal modulator of a sixth embodiment according to the present invention.

FIG. 9 is a block diagram showing the construction of an orthogonal modulator of a sixth embodiment according to the present invention.

Two delta sigma modulators 35 and 36 outputs signals D1 and D2, respectively. These signals D1 and D2 are sent to a signal converter 37. The signal converter 37 converts the signals D1 and D2 into control signals P1 and P2 for a phase switch, respectively. A local oscillation signal Ca is sent to a 180° phase switch 38. The 180° phase switch 38 outputs the signal Ca with a phase of 0° or 180° according to the control signal P1. The resultant signal is Sent to a 90° phase switch 39. The 90° phase switch 39 outputs the signal Ca with a phase of 0° or 90° according to the control signal P2. As a result, the output of the 90° phase shifter 39 is similar to that of the third embodiment of the present invention. It should be noted that even if the positions of the 180° phase switch 38 and the 90° phase switch 39 are changed each other, an output similar thereto can be obtained.

Figure 10:
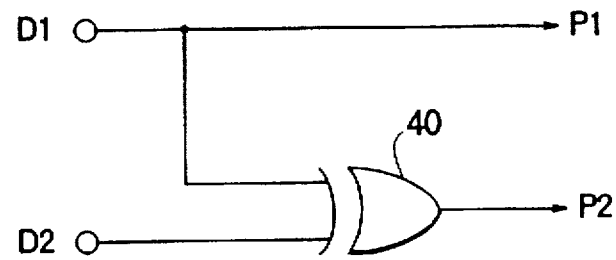
FIG. 10 is a circuit diagram showing the construction of an example of the signal conversion circuit of the sixth embodiment according to the present invention.

FIG. 10 is a circuit diagram showing the construction of an example of the signal converter 37 of the sixth embodiment according to the present invention. The signal converter 37 is constructed of an exclusive-OR circuit 40.

In the case that when P1 and P2 are 1 and that the phase of the output of the phase switch is 0°, when (D1, D2) are (1, 1), the phase of the output is 0°; when (D1, D2) are (1, −1), the phase of the output is 90°; when (D1, D2) are (−1, −1), the phase of the output is 180°; and when (D1, D2) are (−1, 1), the phase of the output is 270°.

Figure 11:
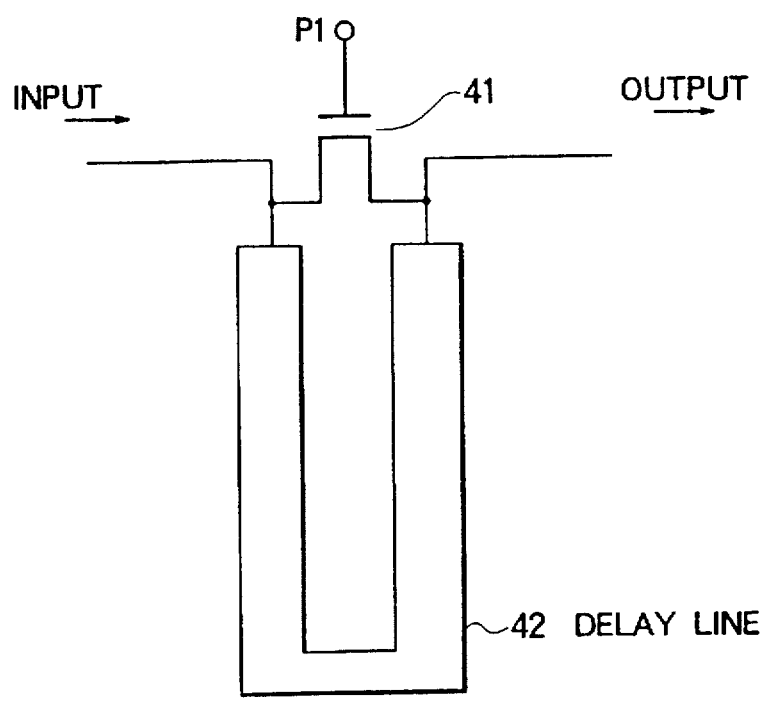
FIG. 11 is a circuit diagram showing the construction of an example of the phase switch of the sixth embodiment according to the present invention.

FIG. 11 is a circuit diagram showing the construction of an example of the phase switch of the sixth embodiment according to the present invention.

When the input and output of the phase switch are short-circuited by a switch 41 according to a control signal P1, the phase switch outputs a signal with a phase delay of 0°. When the input and output of the phase switch is open according to the control signal, the phase switch outputs a signal with a phase delay of 90° or 180° according to the length of a delay line 42.

Figure 12:
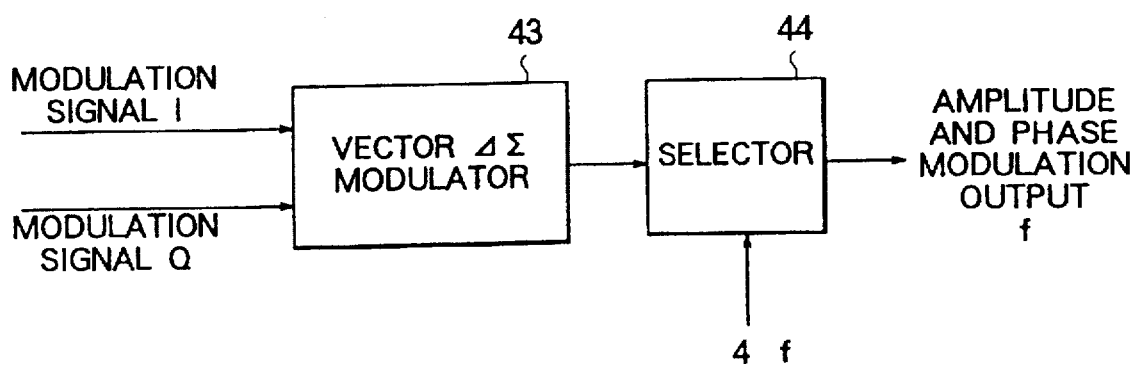
FIG. 12 is a block diagram showing the construction of an amplitude and phase modulator of a seventh embodiment according to the present invention.
Figure 13:
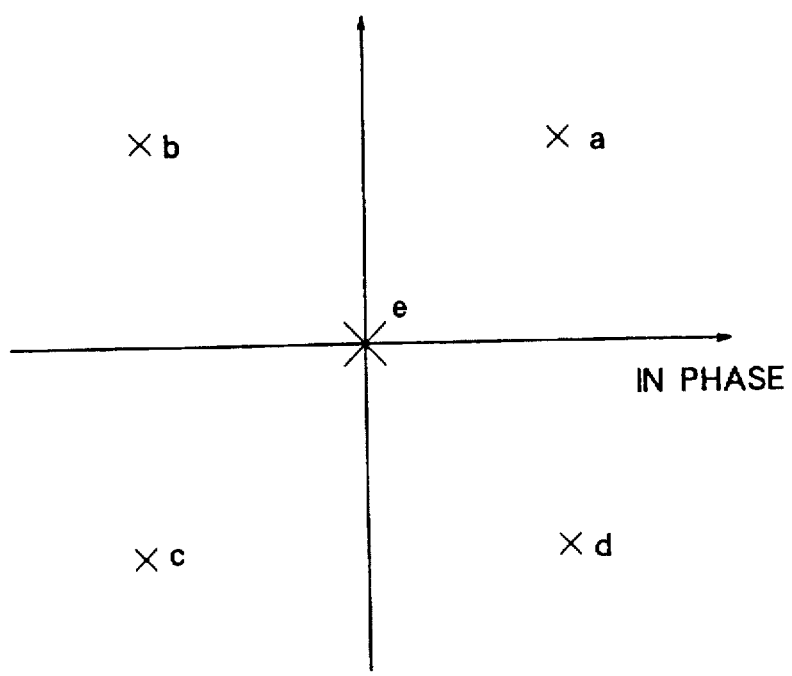
FIG. 13 is a schematic diagram for explaining an output of a selector shown in FIG. 12.

FIG. 12 is a block diagram showing the construction of an amplitude and phase modulator of a seventh embodiment according to the present invention. Modulation signals I and Q are sent to a vector delta sigma modulator 43. The modulator 43 converts the input signals I and Q into a sequence of five symbols a, b, c, d, and e which are selection signals. These signals are sent to a selector 44. When the selection signal a is sent to the selector 44, the selector 44 outputs a signal according to point a on a phase plane shown in FIG. 13. Likewise, when the selection signals b, c, d, and e are sent to the selector 44, the selector 44 outputs signals according to points b, c, d, and e on the phase plane of the figure, respectively. The selector 44 receives a reference signal with a frequency 4f which is four times higher than the frequency of a required output signal. A frequency division circuit be contained in the selector 44 generates four signals according to points a to d on the phase plane. The signal e represents the state where the output is stopped. Since the selector 44 outputs four signals with the same amplitude and phases which differ each other and a signal which represents the state where the output is stopped. Thus, the selector 44 can be constructed of a switching circuit.

Figure 14:
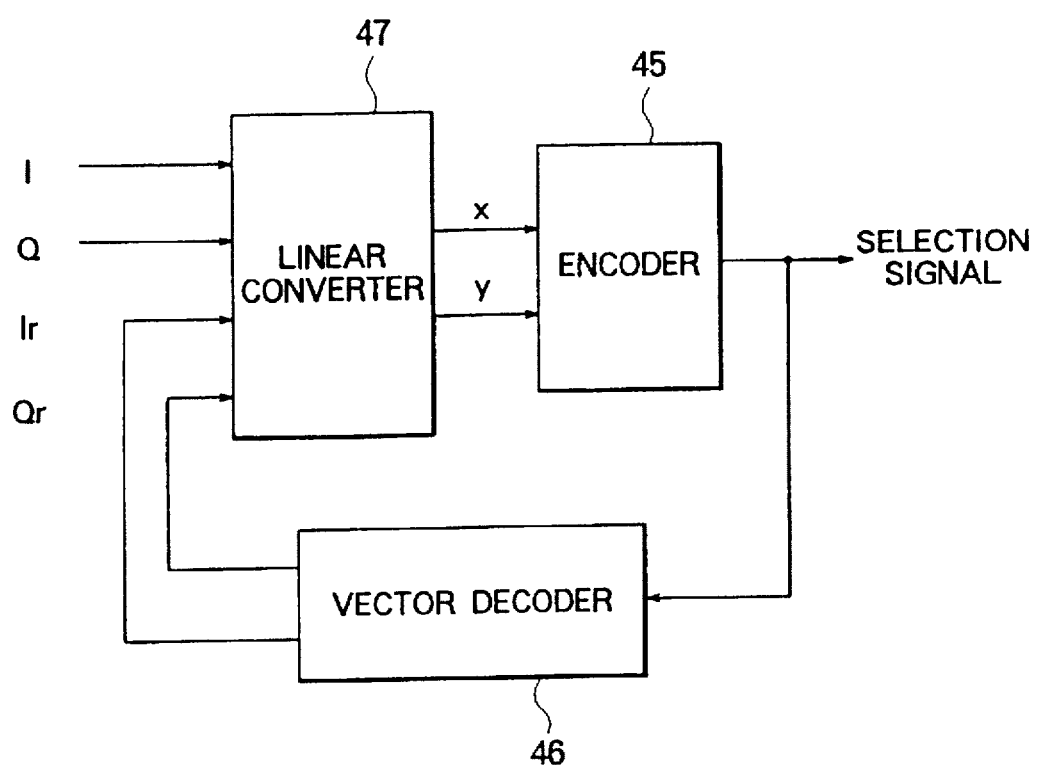
FIG. 14 is a block diagram showing the construction of the vector delta sigma modulator for use in the amplitude and phase modulator shown in FIG. 12.
Figures 15, 16:
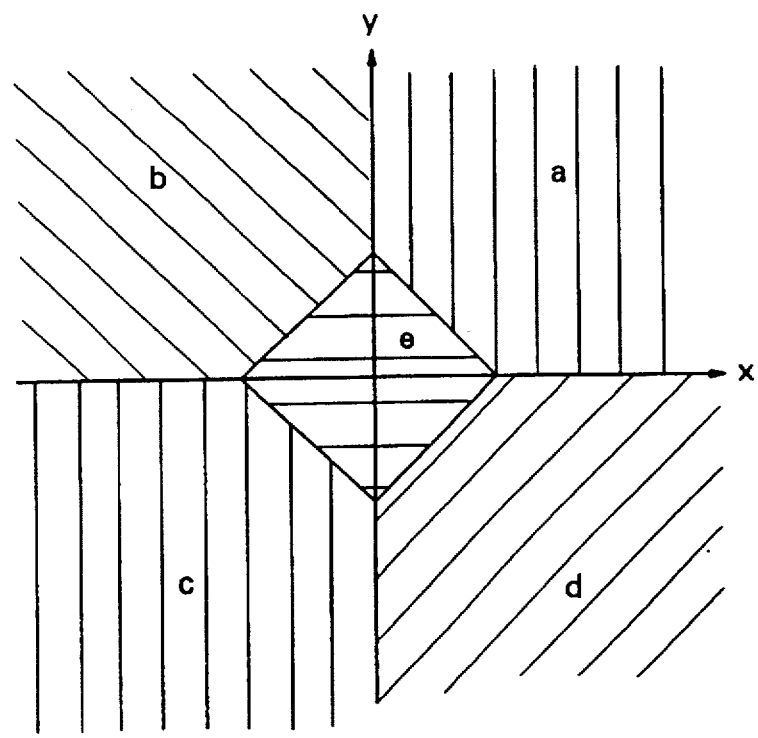
FIG. 15 is a schematic diagram for explaining an output of an encoder shown in FIG. 14.
FIG. 16 is a table for explaining an output of a vector decoder shown in FIG. 14.

FIG. 14 is a block diagram showing the construction of the vector delta sigma modulator 43 for use in the amplitude and phase modulator shown in FIG. 12. An encoder 45 outputs a code according to coordinates (x, y) represented by two scalar inputs thereof which are contained in regions a, b, c, d, and e on the coordinate plane of FIG. 15. The output of the encoder 45 is output as an output signal (selection signal) of the vector delta sigma modulator 43. In addition, the output of the encoder 45 is input to a vector decoder 46. The vector decoder 46 outputs the coordinates on the phase plane of the output of the selector 44. The coordinates of each point on the phase plane shown in FIG. 13 can be represented by a table shown in FIG. 16. This table represents the relation between the input and output of the vector decoder 46.

The relation between the input and output of a linear converter can be generally represented by the following formula.

$$\begin{pmatrix} I \\ Q \end{pmatrix} = \begin{pmatrix} F11(Z^{-1}) & F12(Z^{-1}) & F13(Z^{-1}) & F14(Z^{-1}) \\ F21(Z^{-1}) & F22(Z^{-1}) & F23(Z^{-1}) & F24(Z^{-1}) \end{pmatrix} \begin{pmatrix} I \\ Q \\ Ir \\ Qr \end{pmatrix} \quad \text{(formula 1)}$$

When each element of transformation matrix is given as follows, an amplitude and phase modulation wave similar to those of the third to sixth embodiments can be obtained.

$$F11(Z^{-1}) = F22(Z^{-1}) = -F13(Z^{-1}) = -F24(Z^{-1}) = \frac{1}{1 - Z_{-1}} \quad \text{(formula 2)}$$

$$F21(Z^{-1}) = F12(Z^{-1}) = F23(Z^{-1}) = F14(Z^{-1}) = 0$$

However, in the case of the third to sixth embodiments, the output of signal e equivalent to the origin of the phase plane cannot be selected. Thus, according to the seventh embodiment which can select the output of signal e, the amount of quantization noise can be decreased.

In addition, according to the third to sixth embodiments, the frequency characteristic of quantization noise is symmetrical to the carrier frequency. However, since the vector delta sigma modulator has the characteristics of a linear converter, frequency characteristics which are asymmetrical to the carrier frequency can be obtained.

Figure 17:
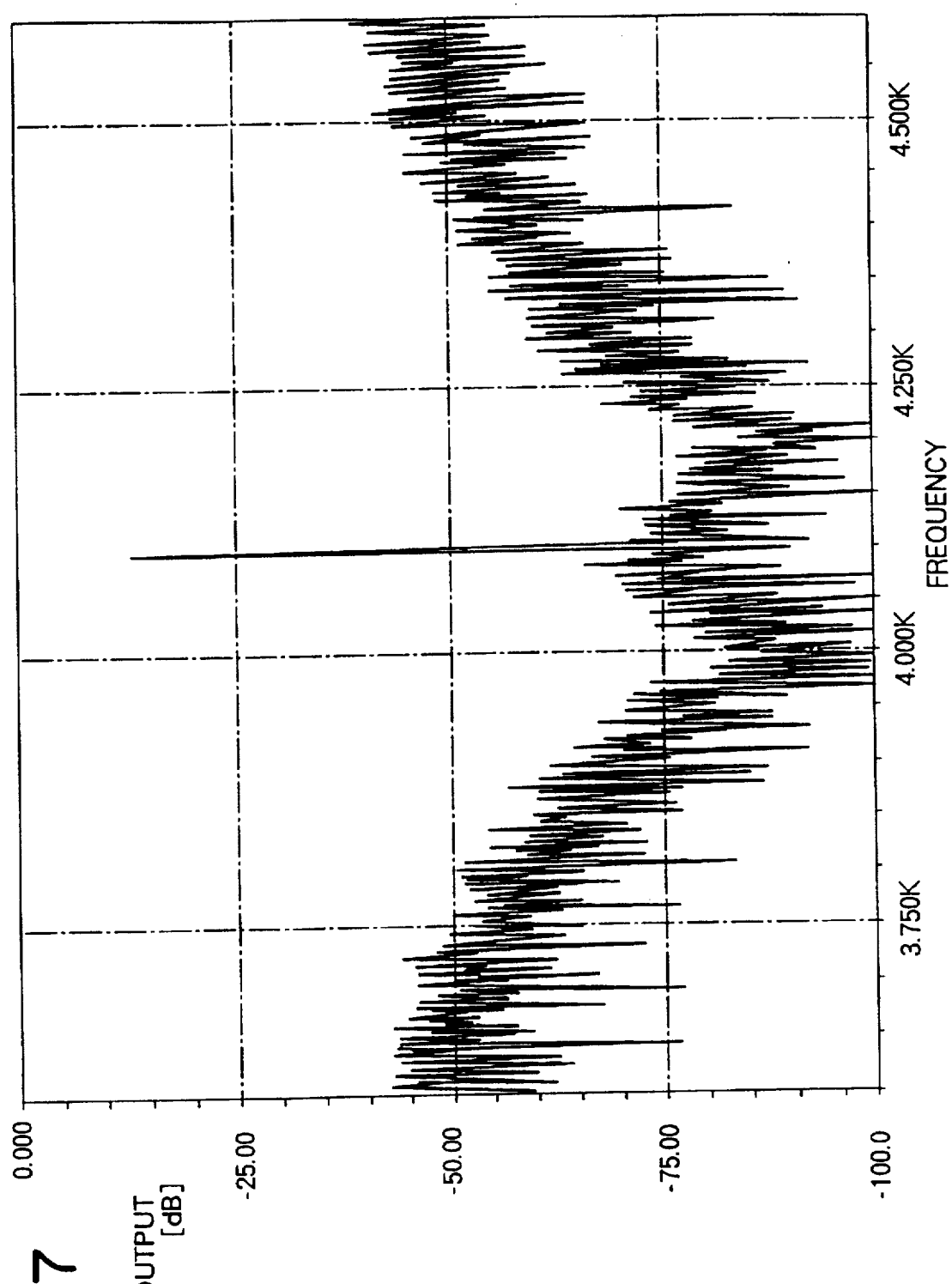
FIG. 17 is graph showing a spectrum of an output signal of the amplitude and phase modulator of the fifth embodiment according to the present invention, the spectrum being obtained by a computer simulation.

FIG. 17 is graph showing a spectrum of an output signal of the amplitude and phase modulator of the fifth embodiment according to the present invention. This spectrum was obtained by a computer simulation. By mixing a carrier frequency of 4096 Hz with a modulation frequency of 4 Hz, a signal with a frequency of 4100 Hz is output. The delta sigma modulators 30 and 31 each have a secondary loop filter whose pole is present at 100 Hz. Since this filter only permits real coefficients, the pole should be present on the real axis. Otherwise, poles which have the relation of a complex conjugate should be present. On the spectrum of quantization noise, there are minimum points at carrier frequency ±100 Hz, namely 3996 Hz and 4192 Hz.

Figure 18:
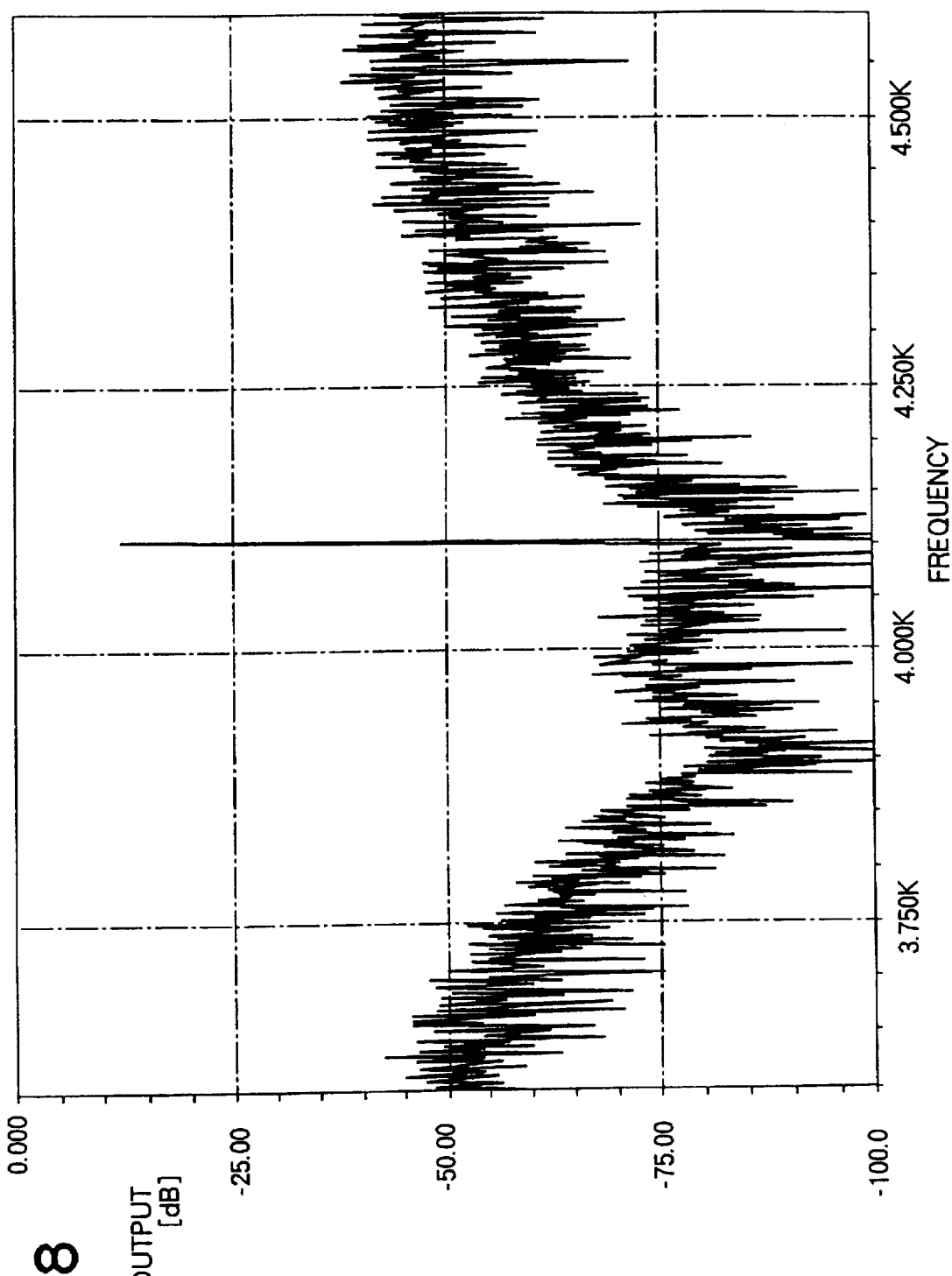
FIG. 18 is a graph showing a spectrum of an output signal of the amplitude and phase modulator of the seventh embodiment, the spectrum being obtained by a computer simulation.

FIG. 18 is a graph showing a spectrum of an output signal of the amplitude and phase modulator of the seventh embodiment. The spectrum was obtained by a computer simulation. The carrier frequency and the modulation signal of the seventh embodiment are similar to those of the fifth embodiment. However, in the seventh embodiment, the vector delta sigma modulator is used. Thus, the liner converter 47 can form a complex coefficient filter. With the complex coefficient filter, the position of an pole can be designated without the relation of complex conjugate. In this example, poles are positioned at 10 Hz and −200 Hz. As a result, there are minimum points of quantization noise at 3896 Hz and 4106 Hz.

Figure 19:
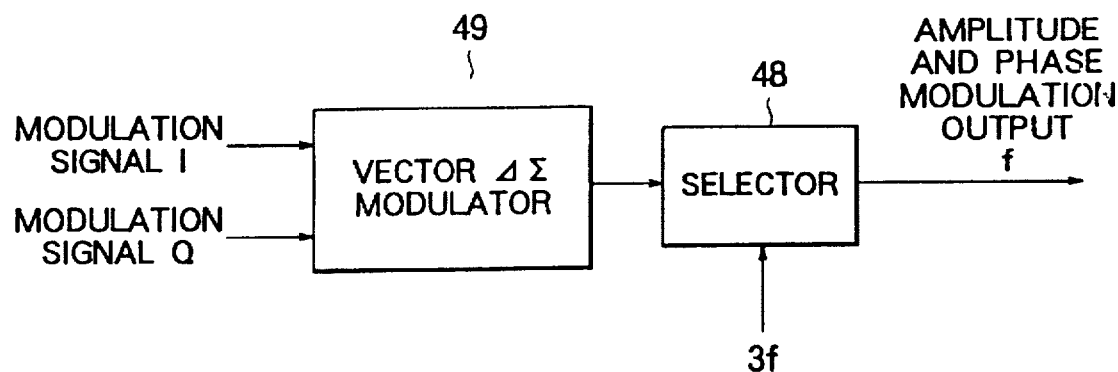
FIG. 19 is a block diagram showing the construction of an amplitude and phase modulator of an eighth embodiment according to the present invention.

FIG. 19 is a block diagram showing the construction of an amplitude and phase modulator of an eighth embodiment according to the present invention. A reference signal is sent to a selector 48. The frequency of the reference signal is three times higher than that of a required output signal. By dividing the frequency of this signal by 3, signals with phases which differ by 120° can be generated.

Figure 20:
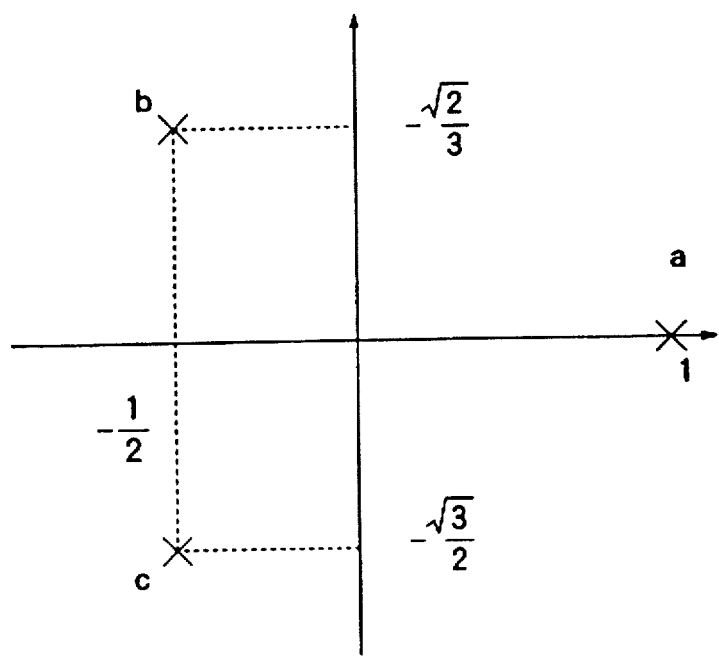
FIG. 20 is a schematic diagram for explaining an output of a selector shown in FIG. 19.

Modulation signals I and Q are sent to a vector delta sigma modulation circuit 49. The circuit 49 converts the signals I and Q into a sequence of three selection signals a, b, and c. When the selection signals a, b, and c are sent to the selector 48, it outputs signals according to points represented by a, b, and c on a phase plane shown in FIG. 20. In this example, since the selector 48 handles only signals with the same amplitude, it can be constructed of a switching circuit.

Figure 21:
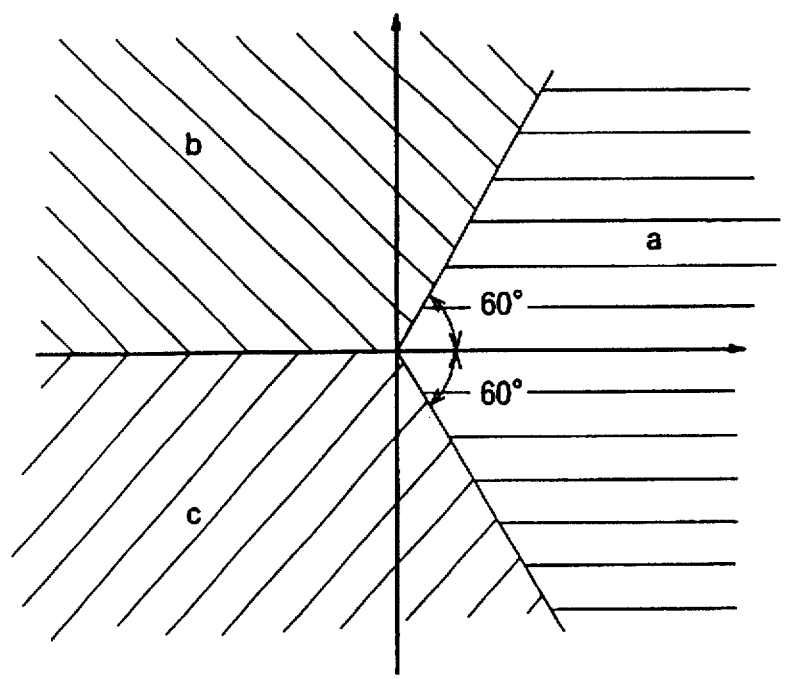
FIG. 21 is a schematic diagram for explaining an output of an encoder of the eighth embodiment.
Figures 22, 23:
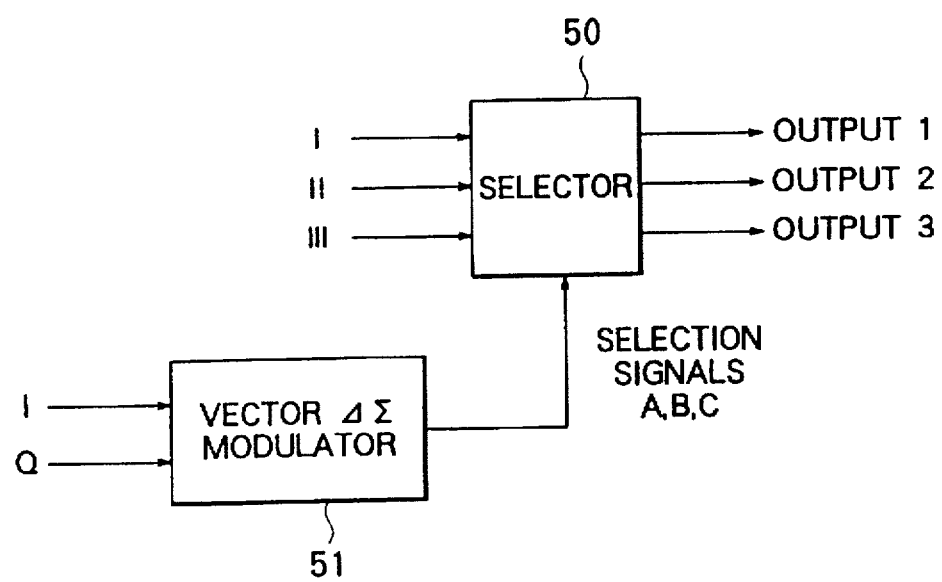
FIG. 22 is a table showing the relation between input and output of a vector decoder of the eighth embodiment.
FIG. 23 is a schematic diagram for explaining a ninth embodiment according to the present invention.

The construction of the vector delta sigma modulator 49 shown in FIG. 19 is similar to that of the modulator shown in FIG. 14. However, the encoder 45 outputs a code according to coordinates represented by two scalar inputs contained in regions a, b, and c on a coordinate plane shown in FIG. 21. FIG. 22 shows the relation between the input and output of the vector decoder 46. The relation between the input and output of the linear converter 47 can be represented by the formula 1. When each element of the transformation matrix is given by the formula 2, an amplitude and phase modulation wave can be obtained, which is similar to that obtained by two sets of conventional sigma delta converters. In this example, since there are only three output points, the amount of quantization noise increases. However, in this example, with a frequency three times higher than that of the desired wave rather than four times, a modulation signal can be accurately obtained.

FIG. 23 is a schematic diagram for explaining a ninth embodiment according to the present invention. In this embodiment, the present invention is applied to an inverter which is mainly used for controlling electric power. This inverter is mathematically the same as a modulator.

Figure 24:
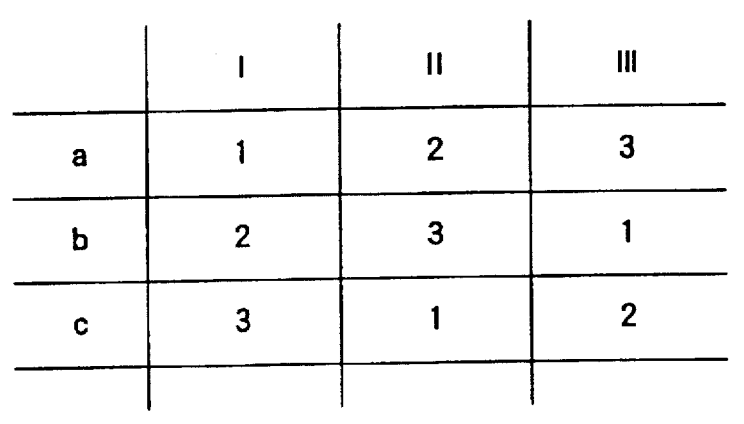

Three-phase AC is supplied to a selector 50. A vector delta sigma modulator 51 outputs three selection signals a, b, and c. When the selection signal a is sent to the selector 50, as shown in FIG. 24, inputs I, II, and III are connected to outputs 1, 2, and 3, respectively. When the selection signal b is sent to the selector 50, the inputs I, II, and III are connected to the outputs 2, 3, and 1, respectively. When the selection signal c is sent to the selector 50, the inputs I, II, and III are connected to the outputs 3, 1, and 2, respectively.

Now, consider an example where a power with a frequency of 60 Hz is input and this frequency is converted into 50 Hz.

In this example, sine signals with a frequency of 10 Hz and phases which differ by 90° each other are sent to a vector delta sigma modulator 51.

The construction of the vector delta sigma converter 51 is similar to that of the eighth embodiment. The output frequency is lower than the input frequency of 60 Hz by 10 Hz. Thus, a minimum point of the quantization noise can be placed at only 50 Hz rather than 70 Hz.

Figure 25:
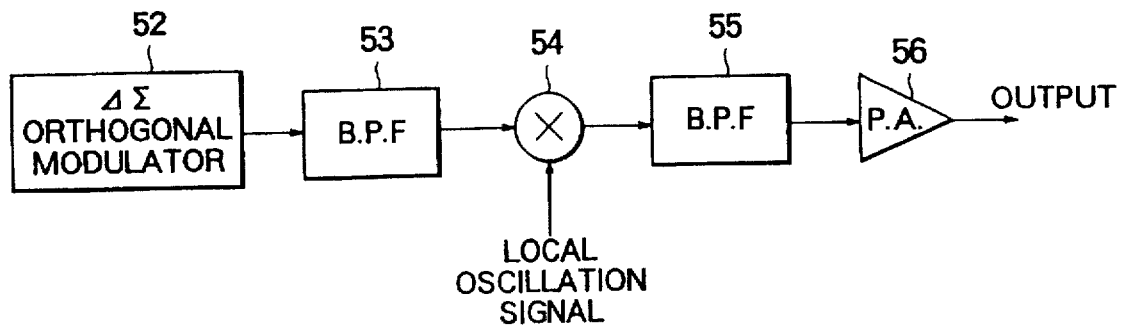
FIG. 25 is a block diagram showing the construction of a transmitter using a delta sigma orthogonal modulator of the embodiment.

FIG. 25 is a block diagram showing the construction of a transmitter using the delta sigma orthogonal modulator of the embodiment.

As shown in the figure, a band-pass filter 53 removes signals which are out of a desired frequency band from output signals of a delta sigma orthogonal modulator 52. The resultant signal is sent to a mixer 54. The mixer 54 mixes the output signal of the band-pass filter 53 and a local oscillation signal. The mixed signal is sent to a band-pass filter 55. The band-pass filter 55 outputs a signal with a desired frequency. This signal is sent to a linear amplifier 56. The linear amplifier 56 amplifies the power of the input signal and outputs the amplified signal.

Figure 26:
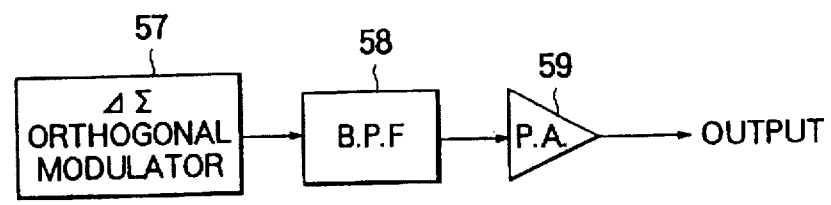
FIG. 26 is a block diagram showing the construction of another transmitter using the delta sigma orthogonal modulator of the embodiment.

FIG. 26 is a block diagram showing the construction of another transmitter using the delta sigma orthogonal modulator of the embodiment.

As shown in the figure, a band-pass filter 58 removes signals which are out of a desired frequency band from output signals of a delta sigma orthogonal modulator 57. The resultant signal is sent to a linear amplifier 59. The linear amplifier 59 amplifies the power of the input signal and outputs the amplified signal.

Figure 27:
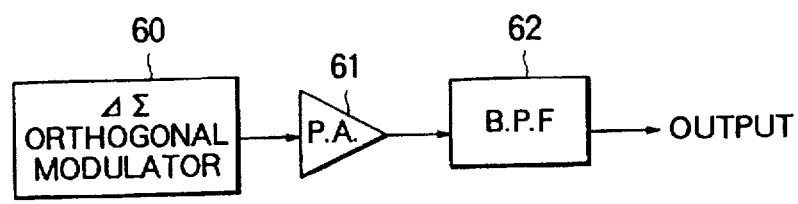
FIG. 27 is a block diagram showing the construction of a further other transmitter using the delta sigma orthogonal modulator of the embodiment.
Figure 30:
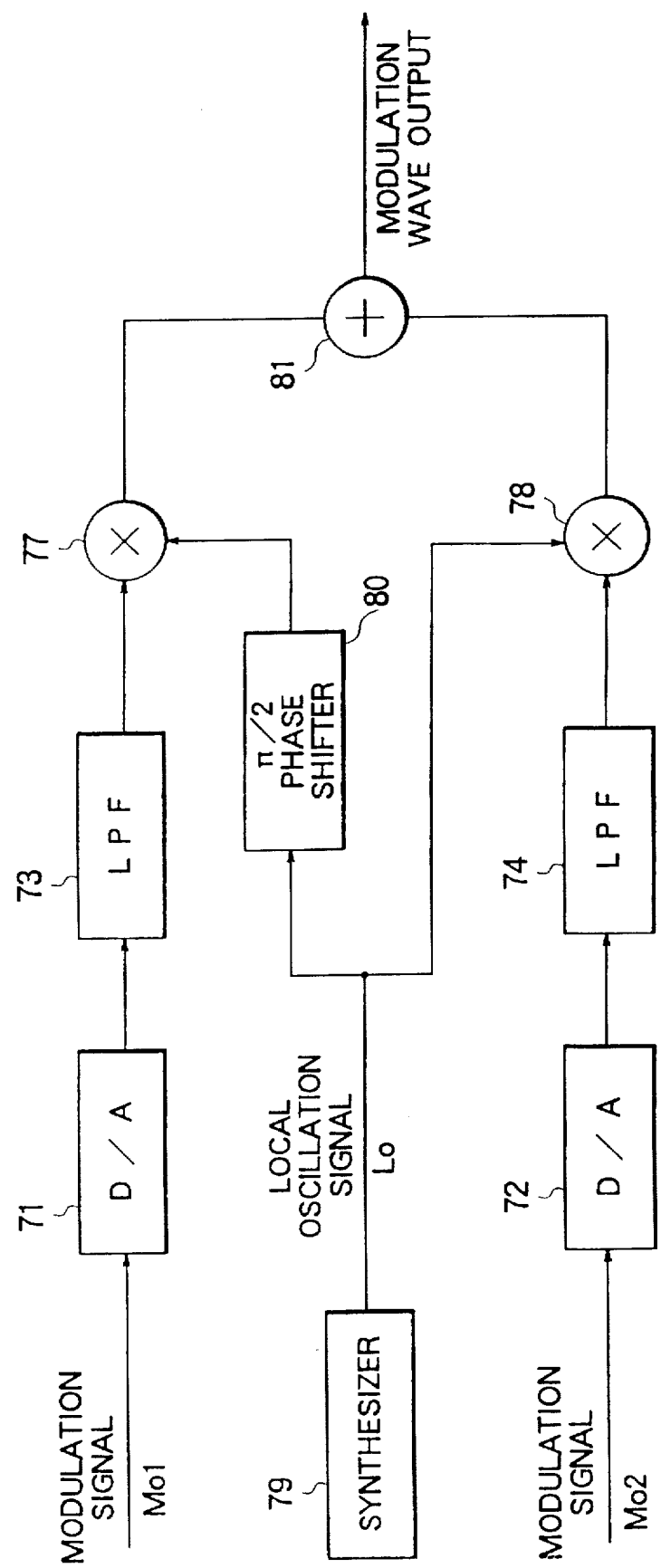
FIG. 30 is a block diagram showing the construction of an example of a conventional orthogonal modulator.

FIG. 27 is a block diagram showing the construction of a further other transmitter using the delta sigma orthogonal modulator of the embodiment.

As shown in the figure, an output signal of a delta sigma orthogonal modulator 60 is nonlinear-amplified by a nonlinear amplifier 61. Since the amplitude of the output signal of the delta sigma orthogonal modulator 60 is constant, the nonlinear amplifier 61 should have a high efficiency. When the output signal of the delta sigma orthogonal modulator 60 is nonlinear- amplified by the nonlinear amplifier 61, the resultant signal is sent to a band-pass filter 62. The band-pass filter 62 selects only a desired frequency band and outputs the resultant signal. In radio transmitters, in particular mobile communication, the output power should be controlled. In the conventional transmitters, the output power is controlled by using a variable gain amplifier or a variable attenuator. However, in the system using a switching amplifier as an output means, one of different control systems should be used. Since the amplitude and phase modulation system is used, a method where the amplitude of a modulation signal is decreased can be used. In addition, by thinning out an input signal (output of the selector) according to the output power as shown in FIGS. 28(a)–28(d), the output can be also controlled. In other words, FIG. 28 (b) shows the output of the selector in the full power state. By causing the selector to output the signal for the half period as shown in FIG. 28 (b), the output power can be halved. By causing the selector to output the signal for the quarter period as shown in FIG. 28 (c), the output power can be quartered. FIG. 29 is a conceptual schematic diagram showing a class D amplifier. The output of this amplifier is almost proportional to power supply voltage VDD. Thus, when the power supply voltage VDD is controlled by a high efficient voltage control circuit such as a switching regulator, even if the output power is low, the efficiency of the amplifier is high.

As described above, according to the present invention, a modulator with high accuracy provided by a digital circuit can be accomplished using a power consumption equal to or lower than that of an analog circuit.

In addition, the modulator according to the present invention is basically constructed of a switching circuit (logical circuit). Thus, the modulator is suitable for a microcomputer. Moreover, since the modulator does not require an interface circuit or can use a simple interface for forming a control system.

Furthermore, by using a vector sigma delta modulation, the degree of freedom of the frequency characteristics with respect to quantization noise increases. Thus, the clock frequency can be lowered and thereby the power consumption can be further decreased.

Thus, by using to the modulator according to the present invention, the size of the radio transmitter can be reduced.

Although the present invention has been shown and described with respect to a best mode embodiment thereof, it should be understood by those skilled in the art that the foregoing and various other changes, omissions, and additions in the form and detail thereof may be made therein without departing from the spirit and scope of the present invention.

What is claimed is:

1. A transmitter comprising:
    a modulator having a delta sigma modulator for converting a modulation signal into a ternary signal;

multiplication means for multiplying said ternary signal and a carrier signal and for outputting the product of said carrier signal and said ternary signal; and an amplifier having means for amplifying the product output by the multiplication means.

2. The transmitter as set forth in claim 1, further comprising:

filter means for filtering the product output by the multiplication means and for outputting a signal with a desired frequency.

3. The transmitter as set forth in claim 2, further comprising:

means for mixing the signal output by the filter means and a local oscillation signal.

4. The transmitter as set forth in claim 1, further comprising:

filter means for filtering the signal output by the amplifying means and for outputting a signal with a desired frequency.

5. The transmitter as set forth in claim 1, wherein values of the ternary signal are 1, 0, and −1.

6. The transmitter as set forth in claim 1, wherein the multiplication means is an analog multiplication circuit.

7. The transmitter as set forth in claim 6, wherein the analog multiplication circuit is selected from a group consisting of: a Gilbert multiplication circuit and a diode ring modulation circuit.

8. The transmitter as set forth in claim 1, wherein the multiplication means is an exclusive-OR circuit.

9. A modulator comprising:

phase shift means for converting an input signal into a first carrier signal of a first phase and a second carrier signal of a second phase, the first phase and the second phase differing by 90°;

a first delta sigma modulator for converting a first modulation signal into a binary or ternary signal;

first multiplication means for multiplying the first binary or ternary signal by the first carrier signal;

a second delta sigma modulator for converting a second modulation signal into a second binary or ternary signal;

second multiplication means for multiplying the second binary or ternary signal by the second carrier signal;

composition means for composing an output of the first multiplication means and an output of the second multiplication means and for outputting an amplitude and phase modulation signal; and an amplifier having means for amplifying the amplitude and phase modulation signal.

10. The transmitter as set forth in claim 9, further comprising:

filter means for filtering the product output by the multiplication means and for outputting a signal with a desired frequency.

11. The transmitter as set forth in claim 10, further comprising:

means for mixing the signal output by the filter means and a local oscillation signal.

12. The transmitter as set forth in claim 9, further comprising:

filter means for filtering the signal output by the amplifying means and for outputting a signal with a desired frequency.

13. A transmitter comprising:

a modulator having a delta sigma modulator for converting a modulation signal into a binary signal, wherein values of the binary signal are 1 and −1;

multiplication means for multiplying said binary signal and a carrier signal and for outputting the product of said carrier signal and said binary signal; and an amplifier having means for amplifying the product output by the multiplication means.

14. The transmitter as set forth in claim 13, wherein the multiplication means is an analog multiplication circuit.

15. The transmitter as set forth in claim 13, further comprising:

filter means for filtering the product output by the multiplication means and for outputting a signal with a desired frequency.

16. The transmitter as set forth in claim 15, further comprising:

means for mixing the signal output by the filter means and local oscillation signal.

17. The transmitter as set forth in claim 13, further comprising:

filter means for filtering the signal output by the amplifying means an for outputting a signal with a desired frequency.

18. A transmitter comprising:

a modulator having a delta sigma modulator for converting a modulation signal into a binary signal;

multiplication means for multiplying said binary signal and a carrier signal, changing the phase of the carrier signal to a normal phase or an opposite phase according the binary signal, and outputting a phase change signal according to the normal phase or the opposite phase; and an amplifier having means for amplifying the phase changed signal output by the multiplication means.

19. The transmitter as set forth in claim 18, further comprising:

filter means for filtering the product output by the multiplication means and for outputting a signal with a desired frequency.

20. The transmitter as set forth in claim 19, further comprising:

means for mixing the signal output by the filter means and a local oscillation signal.

21. The transmitter as set forth in claim 18, further comprising:

filter means for filtering the signal output by the amplifying means and for outputting a signal with a desired frequency.

* * * * *

UNITED STATES PATENT AND TRADEMARK OFFICE
CERTIFICATE OF CORRECTION

PATENT NO.: 5,714,916

DATED: February 3, 1998

INVENTOR(S): Takafumi YAMAJI

It is certified that an error appears in the above-identified patent and that said Letters Patent is hereby corrected as shown below:

Claim 1, col. 13, line 4, after "amplifying" insert --a signal at least partially corresponding to--.

Claim 9, col. 13, line 50, after "amplifying" insert --a signal at least partially corresponding to--.

Claim 13, col. 14, line 15, after "amplifying" insert --a signal at least partially corresponding to--.

Claim 18, col. 14, line 43, after "amplifying" insert --a signal at least partially corresponding to--.

Signed and Sealed this

Twentieth Day of October, 1998

Attest:

BRUCE LEHMAN

*Attesting Officer*  *Commissioner of Patents and Trademarks*